United States Patent
Kim et al.

(10) Patent No.: US 10,440,815 B2
(45) Date of Patent: Oct. 8, 2019

(54) FLEXIBLE CIRCUIT BOARD WITH IMPROVED BONDING POSITION ACCURACY

(71) Applicant: GigaLane Co., Ltd., Hwaseong-si, Gyeonggi-do (KR)

(72) Inventors: Sang Pil Kim, Hwaseong-si (KR); Byung Hoon Jo, Hwaseong-si (KR); Byung Yeol Kim, Hwaseong-si (KR); Hee seok Jung, Hwaseong-si (KR)

(73) Assignee: GigaLane Co., Ltd., Hwaseong-si, Gyeonggi-do (KR)

( * ) Notice: Subject to any disclaimer, the term of this patent is extended or adjusted under 35 U.S.C. 154(b) by 0 days.

(21) Appl. No.: 16/424,553

(22) Filed: May 29, 2019

(65) Prior Publication Data

US 2019/0281695 A1    Sep. 12, 2019

Related U.S. Application Data

(62) Division of application No. 16/224,975, filed on Dec. 19, 2018.

(30) Foreign Application Priority Data

Jan. 25, 2018    (KR) .................... 10-2018-0009432

(51) Int. Cl.
*H05K 1/02* (2006.01)
*H05K 1/11* (2006.01)
*H05K 3/28* (2006.01)

(52) U.S. Cl.
CPC .......... *H05K 1/0266* (2013.01); *H05K 1/028* (2013.01); *H05K 1/111* (2013.01); *H05K 3/28* (2013.01)

(58) Field of Classification Search
CPC ...... H05K 1/0266; H05K 1/028; H05K 1/111; H05K 1/0271; H05K 1/025; H05K 1/0253; H05K 1/024; H05K 1/0227; H05K 1/0221; H05K 3/28; H05K 3/3452; H05K 3/36; H05K 3/361; H05K 3/363; H05K 2201/0715; H05K 2201/0723;
(Continued)

(56) References Cited

U.S. PATENT DOCUMENTS 4,645,114 A * 2/1987 Van Den Brekel .... H05K 1/111
228/180.21
5,014,162 A * 5/1991 Clark ................... H05K 3/3484
361/749
(Continued)

FOREIGN PATENT DOCUMENTS

KR    1020080031713 A    4/2008
KR    1020090061438 A    6/2009
(Continued)

*Primary Examiner* — Roshn K Varghese
(74) *Attorney, Agent, or Firm* — Brundidge & Stanger, P.C.

(57) ABSTRACT

In one example, a flexible circuit board includes a signal line disposed between a first ground and a second ground; a dielectric disposed between the first ground and the signal line and between the second ground and the signal line; a cover layer disposed below the first ground and having openings formed therein such that the first ground is exposed at certain intervals; and a position alignment portion formed across the opening and configured to bisect an area of the opening.

1 Claim, 9 Drawing Sheets

(58) Field of Classification Search
CPC .......... H05K 2201/09045; H05K 2201/09063;
H05K 2201/0191; H05K 2201/2036;
H05K 2201/0989; H05K 2201/0364;
H01L 21/6838; H01L 21/563; G03F
7/70708; H01P 3/08; H01P 3/081; H01P
3/082; H01P 3/084; H01P 3/085; H01P
3/087; H01P 3/088
See application file for complete search history.

(56) References Cited

U.S. PATENT DOCUMENTS

| | | | |
|---|---|---|---|
| 5,200,719 A | 4/1993 | Margulis et al. | |
| 5,712,607 A | 1/1998 | Dittmer et al. | |
| 6,405,920 B1* | 6/2002 | Brunner | H05K 1/111 |
| | | | 228/180.21 |
| 6,608,535 B2 | 8/2003 | Sherman et al. | |
| 6,674,347 B1 | 1/2004 | Maruhashi et al. | |
| 9,019,048 B1 | 4/2015 | Yosui et al. | |
| 2006/0028305 A1 | 2/2006 | Dutta et al. | |
| 2008/0199988 A1 | 8/2008 | Ito et al. | |
| 2008/0224325 A1 | 9/2008 | Nishimura et al. | |
| 2009/0179712 A1 | 7/2009 | Jang et al. | |
| 2014/0048312 A1 | 2/2014 | Kato et al. | |
| 2015/0015345 A1 | 1/2015 | Sasaki et al. | |
| 2015/0042421 A1 | 2/2015 | Kato | |
| 2015/0327359 A1 | 11/2015 | Tuominen et al. | |
| 2017/0162493 A1 | 6/2017 | Murai et al. | |

FOREIGN PATENT DOCUMENTS

| | | |
|---|---|---|
| KR | 101001360 B1 | 12/2010 |
| KR | 200456877 Y1 | 11/2011 |
| KR | 1020170036364 A | 4/2017 |
| KR | 101812317 B1 | 12/2017 |

* cited by examiner

FLEXIBLE CIRCUIT BOARD WITH IMPROVED BONDING POSITION ACCURACY

CROSS-REFERENCE TO RELATED APPLICATION

This application is a Divisional Application of U.S. Ser. No. 16/224,975, filed on Dec. 19, 2018, which claims the benefit under 35 U.S.C. § 119 of a Korean patent application No. 10-2018-0009432 filed on Jan. 25, 2018 in the Korean Intellectual Property Office, the entire disclosures of which are hereby incorporated herein by reference.

TECHNICAL FIELD

The embodiments described herein pertain generally to a flexible circuit board.

BACKGROUND

Recently, a flexible circuit board has gradually replaced a coaxial cable, which has been used for the purpose of transmitting a high frequency signal as a component of wireless terminals such as a smartphone and a tablet personal computer (PC).

In addition, surface mounter technology (SMT) has been used as a method of bonding the flexible circuit board to a printed circuit board.

As shown in FIG. 1, according to the SMT, a flexible circuit board 10 is mounted on a printed circuit board 20, and the flexible circuit board 10 and the printed circuit board 20 are coupled by thermally melting solder 22 between a flexible circuit board ground pad 11 formed below the flexible circuit board 10 and a printed circuit board ground pad 21 formed on the printed circuit board 20.

However, when the flexible circuit board 10 is not properly mounted on the printed circuit board 20, the SMT is not properly performed.

SUMMARY

The present invention has been made to solve the above-mentioned conventional problems and is directed to providing a flexible circuit board with improved bonding position accuracy.

In one example embodiment, a flexible circuit board with improved bonding position accuracy includes: a signal line disposed between a first ground and a second ground; a dielectric disposed between the first ground and the signal line and between the second ground and the signal line; a cover layer disposed below the first ground and having openings formed therein such that the first ground is exposed at certain intervals; and a position alignment portion formed across the opening and configured to bisect an area of the opening.

The position alignment portion may be formed in a diagonal shape.

An area of an upper left side of the opening bisected by the position alignment portion may be equal to an area of a lower right side of the opening bisected by the position alignment portion, and an area of an upper right side of the opening bisected by the position alignment portion may be equal to an area of a lower left side of the opening bisected by the position alignment portion.

The diagonal shape of the position alignment portion formed in the opening may be symmetrical to a diagonal shape of a position alignment portion formed in another opening adjacent to the opening.

In another example embodiment, a flexible circuit board with improved bonding position accuracy includes: a signal line disposed between a first ground and a second ground; a dielectric disposed between the first ground and the signal line and between the second ground and the signal line; via holes formed in a direction orthogonal to a lengthwise direction of the signal line, passing through the first ground, the second ground, and the dielectric in a vertical direction, and formed by filling a plurality of holes, which are formed in the vertical direction such that the first ground and the second ground are electrically connected, with conductors; and a cover layer disposed below the first ground and having openings formed therein such that the via holes are exposed at certain intervals.

The flexible circuit board may further include printed circuit board ground pads coupled to the openings via solder, wherein the printed circuit board ground pads may be formed to be long in a widthwise direction of the signal line at both sides of the signal line interposed therebetween, an inner side of each of the printed circuit board ground pads in the widthwise direction may be formed in a shape the same as a shape obtained by bisecting the opening along a center thereof, and an outer side of each of the printed circuit board ground pads in the widthwise direction may be formed in a shape which extends to have a size equal to a diameter of the opening.

In yet another example embodiment, a flexible circuit board with improved bonding position accuracy includes: a signal line disposed between a first ground and a second ground; a dielectric disposed between the first ground and the signal line and between the second ground and the signal line; ground connection portions formed in a direction orthogonal to a lengthwise direction of the signal line, passing through the first ground, the second ground, and the dielectric in a vertical direction, formed by filling a plurality of trenches, which are formed in the vertical direction such that the first ground and the second ground are electrically connected, with conductors, wherein one side of the conductor is surrounded by the trench to face the signal line in a widthwise direction of the signal line and the other side of the conductor is exposed to the outside; and a cover layer disposed below the first ground and having grooves formed therein such that the ground connection portions are exposed at certain intervals.

The flexible circuit board may further include printed circuit board ground pads coupled to the grooves via solder, wherein the printed circuit board ground pads may be formed to be long in the widthwise direction of the signal line at both sides of the signal line interposed therebetween, an inner side of each of the printed circuit board ground pads in the widthwise direction may be formed in a shape the same as a shape of the groove, and an outer side of each of the printed circuit board ground pads in the widthwise direction may be formed in a shape which extends to have a size equal to a diameter of the groove.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
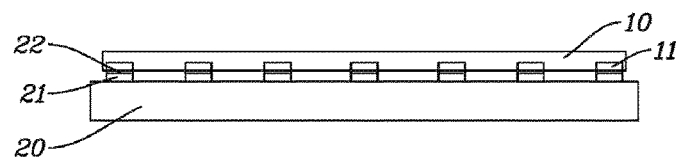
FIG. 1 is a view illustrating a flexible circuit board mounted on a printed circuit board.
Figure 2:
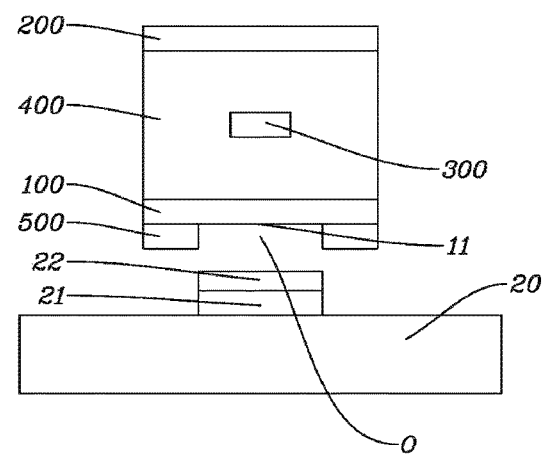
FIGS. 2 to 4 are views illustrating a first example embodiment of the present invention.
Figure 3:
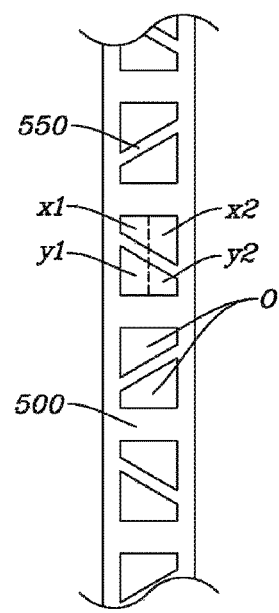

As a first example embodiment for solving a problem in that surface mounter technology (SMT) is not properly performed when a flexible circuit board 10 is not properly mounted on a printed circuit board 20, as shown in FIGS. 2 and 3, the present invention includes a first ground 100, a second ground 200, a signal line 300, a dielectric 400, a cover layer 500, and position alignment portions 550.

The signal line 300 is disposed between the first ground 100 and the second ground 200.

The dielectric 400 is disposed between the first ground 100 and the signal line 300 and between the second ground 200 and the signal line 300.

The cover layer 500 is disposed below the first ground 100.

Openings O are formed in the cover layer 500 at certain intervals such that the first ground 100 is exposed through the openings O.

The first ground 100 exposed at the cover layer 500 becomes a flexible circuit board ground pad 11. The flexible circuit board ground pad 11 and a printed circuit board ground pad 21, which is formed on the printed circuit board 20, are coupled by thermally melting solder 22 therebetween.

An area of the printed circuit board ground pad 21 may be greater than or equal to an area of the opening O.

The position alignment portion 550 is formed across the opening O to bisect the area of the opening O.

A bonding position of an upper side x and a lower side y of the opening O bisected by the position alignment portion 550 is aligned by surface tension generated when the solder 22 is melted.

For example, when an area of the printed circuit board ground pad 21 in contact with the upper side x of the opening O is greater than an area thereof in contact with the lower side y of the opening O, a tensile force is generated toward the lower side y of the opening O due to the surface tension until the areas of the printed circuit board ground pad 21 in contact with the upper side x and the lower side y are equal to each other. As a result, the flexible circuit board 10 is moved downward, thereby aligning the bonding position.

The position alignment portion 550 may be formed to have a diagonal shape rather than a horizontal shape so as to align the bonding position not only in a vertical direction but also in a horizontal direction.

Due to the diagonal shape of the position alignment portion 550, an area of an upper left side x1 of the opening O bisected by the position alignment portion 550 is equal to an area of a lower right side y2 of the opening O bisected by the position alignment portion 550. In addition, an area of an upper right side x2 of the opening O bisected by the position alignment portion 550 is equal to an area of a lower left side y1 of the opening O bisected by the position alignment portion 550.

For example, when an area of the printed circuit board ground pad 21 in contact with the left sides x1 and y1 of the opening O is greater than an area thereof in contact with the right sides x2 and y2 of the opening O, a tensile force is generated toward the right sides x2 and y2 of the opening O due to the surface tension until the areas of the printed circuit board ground pad 21 in contact with the left sides x1 and y1 and the right sides x2 and y2 are equal to each other. As a result, the flexible circuit board 10 is moved rightward, thereby aligning the bonding position.

Since the bonding position is also aligned in the vertical direction as described above, the bonding position is aligned in the vertical and horizontal directions due to the diagonal shape of the position alignment portion 550.

The diagonal shape of the position alignment portion 550 formed in the opening O may be symmetrical to a diagonal shape of a position alignment portion 550 formed in an opening O adjacent to the opening O.

Figure 4:
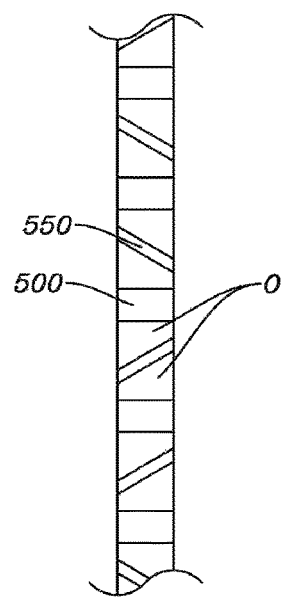

The symmetrical diagonal shapes may be consecutively repeated in an extending direction of the signal line 300. Alternatively, as shown in FIG. 4, the same diagonal shapes may be repeated, and then, symmetrical diagonal shapes may be repeated.

In addition, the opening O may be formed to have a width equal to a width of the flexible circuit board 10.

As described above, the bonding position may be aligned in the vertical and horizontal directions due to the diagonal shape of the position alignment portion 550.

Figure 5:
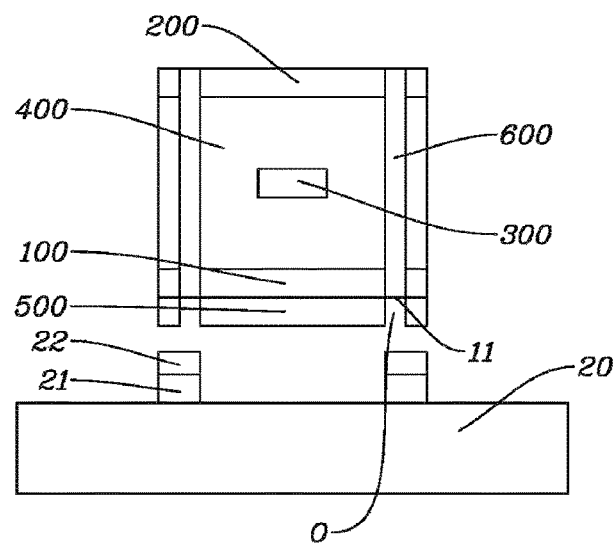
FIGS. 5 to 7 are views illustrating a second example embodiment of the present invention.
Figure 6:
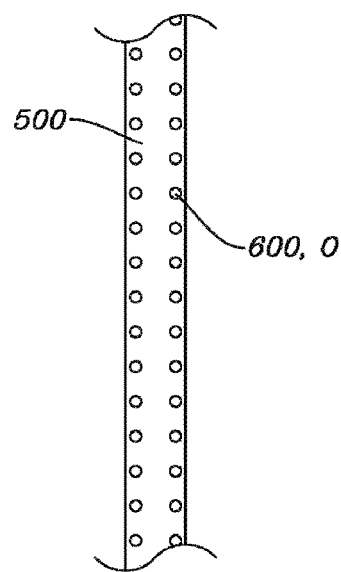

As a second example embodiment for solving a problem in that SMT is not properly performed when a flexible circuit board 10 is not properly mounted on a printed circuit board 20, as shown in FIGS. 5 and 6, the present invention includes a first ground 100, a second ground 200, a signal line 300, a dielectric 400, via holes 600, and a cover layer 500.

Since the first ground 100, the second ground 200, the signal line 300, and the dielectric 400 are the same as those of the first example embodiment described above, descriptions thereof will be omitted.

The via holes 600 are formed in a direction orthogonal to a lengthwise direction of the signal line 300 and pass through the first ground 100, the second ground 200, and the dielectric 400 in a vertical direction. The via holes 600 are formed by filling a plurality of holes, which are formed in the vertical direction such that the first ground 100 and the second ground 200 are electrically connected, with conductors.

The cover layer 500 is disposed below the first ground 100 and has openings O formed therein such that the via holes 600 are exposed at certain intervals.

Figure 7:
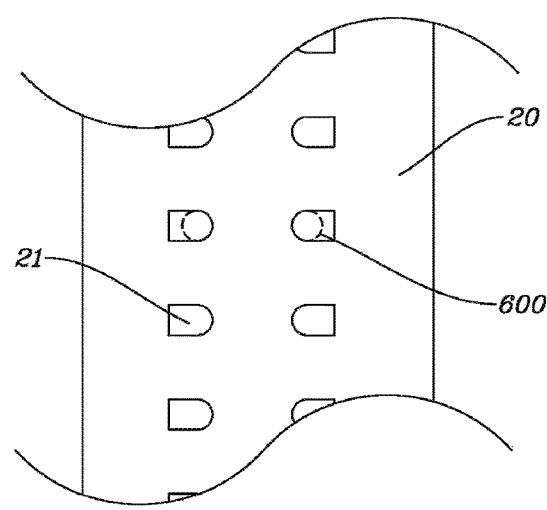

As shown in FIG. 7, printed circuit board ground pads 21 are formed to be long in a widthwise direction of the signal line 300 at both sides of the signal line 300 interposed therebetween. An inner side of the printed circuit board ground pad 21 in the widthwise direction is formed in a shape the same as a shape obtained by bisecting the opening O along a center thereof, and an outer side thereof is formed in a shape which extends to have a size equal to a diameter of the opening O.

Since the shape of the opening O and the shape of the printed circuit board ground pad 21 partially have the same area in the widthwise direction of the signal line 300, a tensile force is generated in the widthwise direction of the signal line 300. Thus, a bonding position is aligned.

As described above, the bonding position is aligned due to the shape of the printed circuit board ground pad 21.

Figure 8:
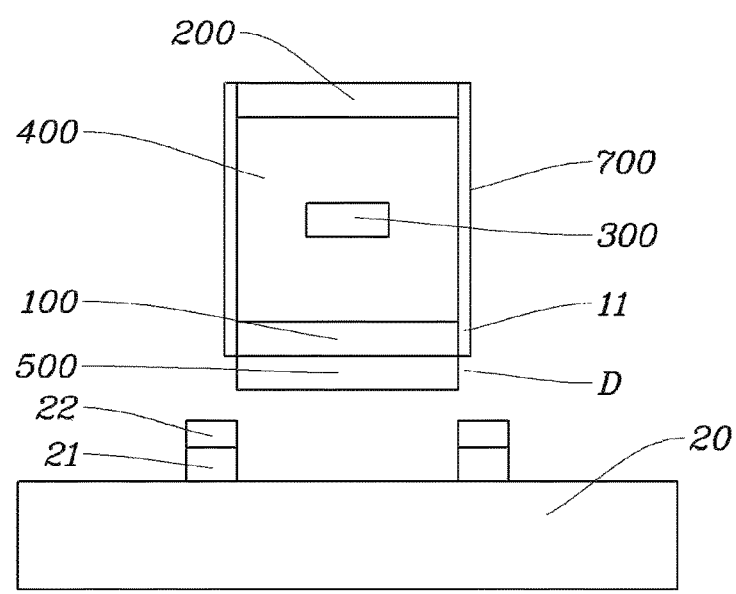
FIGS. 8 to 11 are views illustrating a third example embodiment of the present invention.
Figure 9:
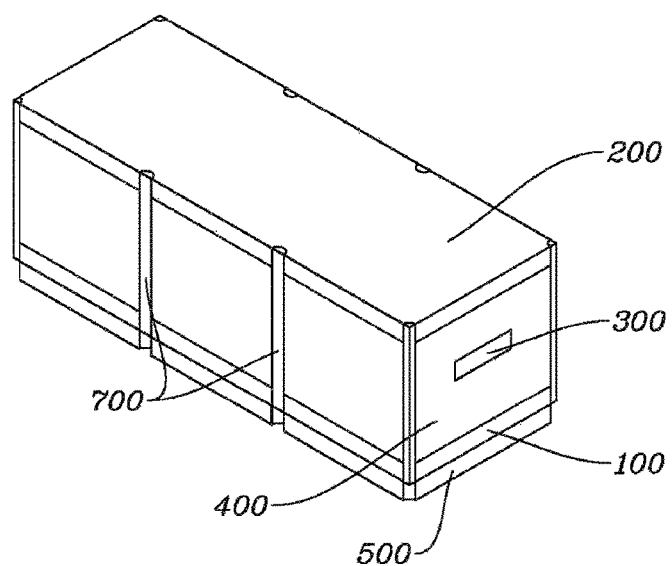
Figure 10:
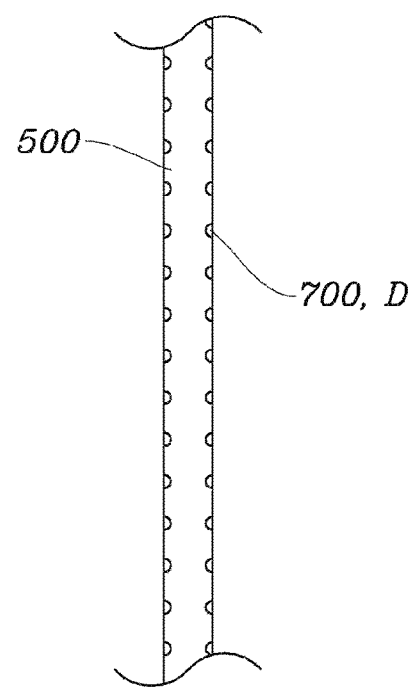

As a third example embodiment for solving a problem in that SMT is not properly performed when a flexible circuit board 10 is not properly mounted on a printed circuit board 20, as shown in FIGS. 8 to 10, the present invention includes a first ground 100, a second ground 200, a signal line 300, a dielectric 400, ground connection portions 700, and a cover layer 500.

Since the first ground 100, the second ground 200, the signal line 300, and the dielectric 400 are the same as those of the first example embodiment described above, descriptions thereof will be omitted.

The ground connection portions 700 are formed in a direction orthogonal to a lengthwise direction of the signal line 300 and pass through the first ground 100, the second ground 200, and the dielectric 400 in a vertical direction. The ground connection portions 700 are formed by filling a plurality of trenches, which are formed in the vertical direction such that the first ground 100 and the second ground 200 are electrically connected, with conductors. One side of the conductor is surrounded by the trench to face the signal line 300 in a widthwise direction of the signal line 300, and the other side of the conductor is exposed to the outside.

The cover layer 500 is disposed below the first ground 100 and has grooves D formed therein such that the ground connection portions 700 are exposed at certain intervals.

Figure 11:
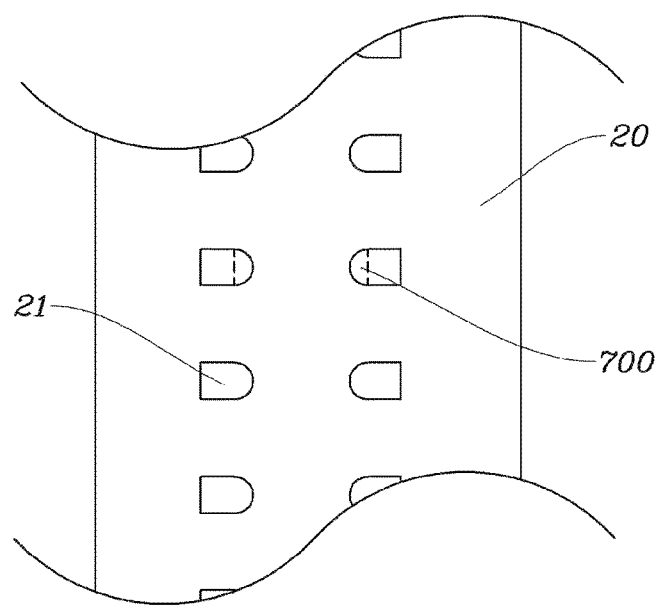

As shown in FIG. 11, printed circuit board ground pads 21 are formed to be long in the widthwise direction of the signal line 300 at both sides of the signal line 300 interposed therebetween. An inner side of the printed circuit board ground pad 21 in the widthwise direction is formed in a shape the same as a shape of the groove D, and an outer side thereof is formed in a shape which extends to have a size equal to a diameter of the groove D.

Since the shape of the groove D and the shape of the printed circuit board ground pad 21 partially have the same area in the widthwise direction of the signal line 300, a tensile force is generated in the widthwise direction of the signal line 300. Thus, a bonding position is aligned.

As described above, the bonding position is aligned due to the shape of the printed circuit board ground pad 21.

A bonding position is aligned in vertical and horizontal directions due to a diagonal shape of a position alignment portion 550.

A bonding position is aligned due to a shape of a printed circuit board ground pad 21.

DESCRIPTION OF REFERENCE NUMERALS

| | | | |
|---|---|---|---|
| 10: | flexible circuit board | 11: | flexible circuit board ground pad |
| 20: | printed circuit board | 21: | printed circuit board ground pad |
| 22: | solder | 100: | first ground |
| 200: | second ground | 300: | signal line |
| 400: | dielectric | 500: | cover layer |
| 550: | position alignment portion | 600: | via hole |
| 700: | ground connection portion | O: | opening |
| D: | groove | | |

We claim:

1. A flexible circuit board with improved bonding position accuracy, comprising:
    a signal line disposed between a first ground and a second ground;
    a dielectric disposed between the first ground and the signal line and between the second ground and the signal line;
    via holes formed in a direction orthogonal to a lengthwise direction of the signal line, configured to pass through the first ground, the second ground, and the dielectric in a vertical direction, and formed by filling a plurality of holes, which are formed in the vertical direction such that the first ground and the second ground are electrically connected, with conductors;
    a cover layer disposed below the first ground and having openings formed therein such that the via holes are exposed at certain intervals; and
    a printed circuit board including printed circuit board ground pads coupled to the openings via solder,
    wherein the printed circuit board ground pads are formed to be long only in a widthwise direction perpendicular to the lengthwise direction of the signal line at both sides of the signal line interposed therebetween, an inner side towards the signal line of each of the printed circuit board ground pads in the widthwise direction is formed in a shape the same as a shape obtained by bisecting the opening along a center thereof, and an outer side away from the signal line of each of the printed circuit board ground pads is formed in a shape which extends only in the widthwise direction to have a size equal to a diameter of the opening.

* * * * *